United States Patent
Gaide

(10) Patent No.: US 9,559,669 B1
(45) Date of Patent: Jan. 31, 2017

(54) CIRCUITS FOR AND METHODS OF GENERATING CLOCK SIGNALS ENABLING THE LATCHING OF DATA IN AN INTEGRATED CIRCUIT

(71) Applicant: Xilinx, Inc., San Jose, CA (US)

(72) Inventor: Brian C. Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/728,741

(22) Filed: Jun. 2, 2015

(51) Int. Cl.
*H03K 3/017* (2006.01)
(52) U.S. Cl.
CPC ..................... *H03K 3/017* (2013.01)
(58) Field of Classification Search
CPC .......... H03K 3/017; H03K 3/284; H03K 5/04; H03K 5/13; H03K 5/1565; H03K 7/08
USPC ....................................................... 327/172
See application file for complete search history.

(56) References Cited

U.S. PATENT DOCUMENTS

2013/0033292 A1* 2/2013 Hamdan .............. H03K 3/0375
327/142

OTHER PUBLICATIONS

Weste, Neil H. E. et al., CMOS VLSI Design, Third Edition, May 11, 2004, pp. 408-409, Pearson Eduction, Upper Saddle River, New Jersey, USA.

* cited by examiner

*Primary Examiner* — John Poos
*Assistant Examiner* — David Mattison
(74) *Attorney, Agent, or Firm* — John J. King

(57) ABSTRACT

A circuit for generating clock signals enabling the latching of data is described. The circuit comprises a pulse generator coupled to receive an input clock signal at an input and to generate an output clock signal at an output; a latch circuit coupled to receive the output clock signal; and a pulse shaping circuit coupled to receive a feedback signal; wherein a pulse width of the output clock signal is determined by the feedback signal and the input signal coupled to the pulse generator. A method of generating clock signals enabling the latching of data is also described.

20 Claims, 4 Drawing Sheets

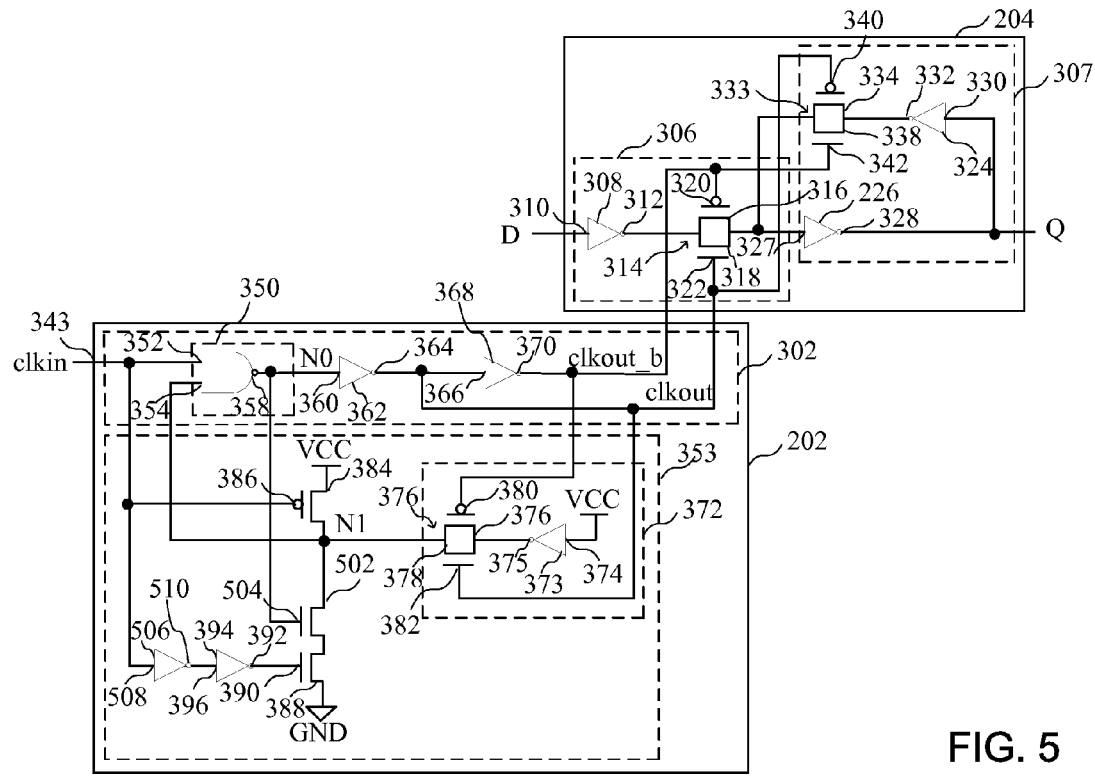
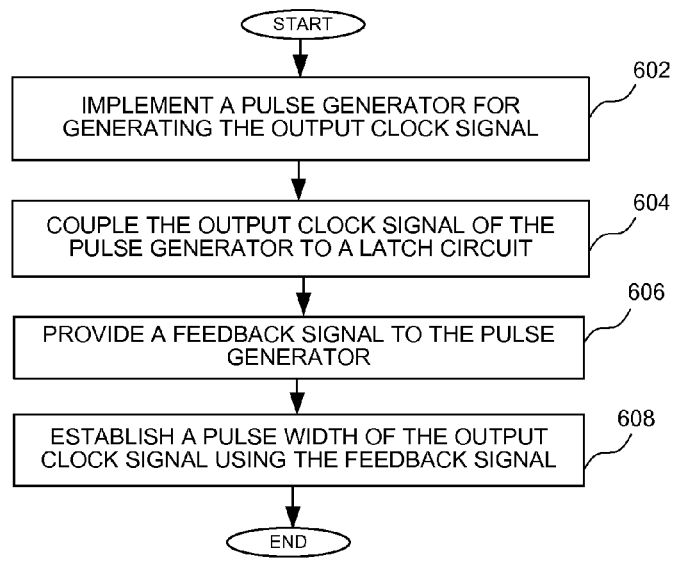
FIG. 5
FIG. 6

CIRCUITS FOR AND METHODS OF GENERATING CLOCK SIGNALS ENABLING THE LATCHING OF DATA IN AN INTEGRATED CIRCUIT

TECHNICAL FIELD

The present invention relates generally to integrated circuit devices, and in particular, to circuits for and methods of generating clock signals enabling the latching of data in an integrated circuit device.

BACKGROUND

A clock generator is an important part of any integrated circuit, where a clock signal generated by the clock generator is used to enable various functions of the integrated circuit. One function that relies upon one or more clocks signals is data transmission. That is, data may be stored by a latch circuit in response to a clock signal.

Typical pulse generators used in pulsed latch systems do not closely match the data path associated with the pulsed latches that the pulse generators drive. A minimum pulse width for correct operation of the circuit changes over process, voltage, and temperature variations. Unless the pulse generator is closely matched to the pulsed latch data path, it will not necessarily track the latch, and will thus provide a wider pulse than necessary in some corners or narrower pulse widths in others. Providing a wider pulse width reduces the hold margins of the latch, while providing a narrower pulse width increases the odds of a functional failure.

According, an improved circuit for generating clock signals enabling the latching of data in an integrated circuit is beneficial.

SUMMARY

A circuit for generating clock signals enabling the latching of data is described. The circuit comprises a pulse generator coupled to receive an input clock signal at an input and to generate an output clock signal at an output; a latch circuit coupled to receive the output clock signal; a pulse shaping circuit coupled to receive a feedback signal; wherein a pulse width of the output clock signal is determined by the feedback signal and the input signal coupled to the pulse generator.

Another circuit for generating clock signals enabling the latching of data comprises a pulse generator coupled to receive an input clock signal at an input and to generate an output clock signal at an output, the pulse generator having a first driver circuit; a latch circuit coupled to receive the output clock signal, the latch circuit having a second driver circuit; and a pulse shaping circuit coupled to receive a feedback signal; wherein the first driver circuit matches the second driver circuit; and wherein a pulse width of the output clock signal is determined by the feedback signal and the input clock signal coupled to the pulse generator.

A method of generating clock signals enabling the latching of data is also described. The method comprises receiving an input clock signal at a pulse generator; generating an output clock signal based upon the input clock signal; coupling the output clock signal to a latch circuit; implementing the output clock signal as a feedback signal to control the pulse generator; and establishing, using a pulse shaping circuit, a pulse width of a pulse of the output clock signal using the feedback signal and the input clock signal.

Other features will be recognized from consideration of the Detailed Description of the Drawings and the Claims, which follow.

BRIEF DESCRIPTION OF THE DRAWINGS

FIG. 5 is another block diagram of a pulse control circuit and a latch circuit;

FIG. 6 is a flow chart showing a method of generating clock signals enabling the latching of data in an integrated circuit.

DETAILED DESCRIPTION

The circuits and methods relate to a pulsed latch pulse generator that tracks characteristics of the latch over process, temperature and voltage (PVT) variations. By tracking the characteristics of a latch, the pulse generator is able to generate a pulse that is shorter, and therefore has less of an impact on hold times. More particularly, by using matched devices and a matched circuit topology in the pulse generator and latch circuit to mimic the latch behavior over PVT, shorter and more reliable pulses are generated. Further, feedback from the output of the pulse generator can be used to modulate a pulse width based on output loading conditions, slew rate, and wire resistance.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
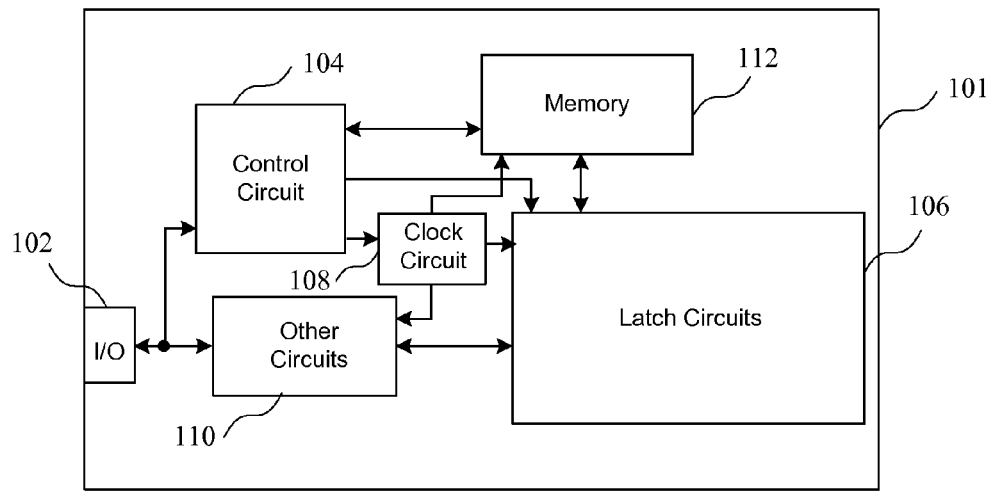
FIG. 1 is a block diagram of an integrated circuit having circuits for controlling latch circuits.

Turning first to FIG. 1, a block diagram of an integrated circuit 101 for controlling latch circuits is shown. In particular, an input/output port 102 is coupled to a control circuit 104 that interfaces with latch circuits 106. A clock circuit 108 is also implemented to provide clocking signals throughout the circuit. The control circuit 104 and clock circuit 108 may also be coupled to other circuits 110 and a memory 112. The circuits and methods set forth in more detail below may be implemented within a single integrated circuit die, or may be implemented in a multi-chip module. As described in more detail below, the clock circuit 108 may comprises a pulse generator for controlling one or more latch circuits.

Figure 2:
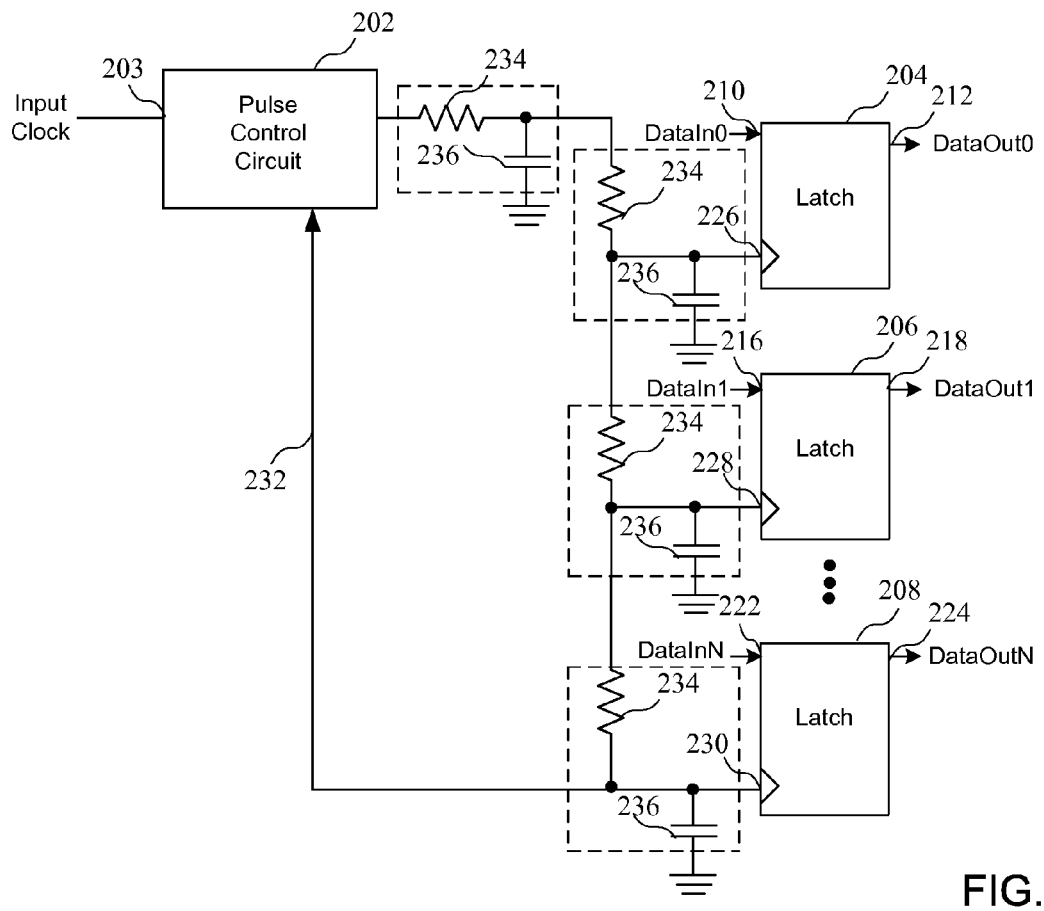
FIG. 2 is a block diagram of a circuit controlling latch circuits in an integrated circuit.

Turning now to FIG. 2, a block diagram of a circuit controlling latch circuits in an integrated circuit is shown. The circuit of FIG. 2 describes the use of a feedback signal coupled to a pulse generator. In particular, a pulse control circuit 202 having an input 203 for receiving an input clock is coupled to a plurality of latch circuits 204-208, where first input data DataIn0 is coupled to an input 210 of the latch circuit 204 and output data DataOut0 is generated at an output 212, second input data DataIn1 is coupled to an input 216 of the latch circuit 206 and output data DataOut1 is generated at an output 218, and Nth input data DataInN is coupled to an input 222 of the latch circuit 208 and output data DataOutN is generated at an output 224. As will be described in more detail below, the pulse control circuit compromises a pulse generator for generating clock signals. A clock single generated by the pulse control circuit 202 is coupled to clock inputs of the latches, including a clock input 226 of the latch circuit 204, a clock input 228 of the latch circuit 206 and a clock input 230 of the latch circuit 208.

A feedback path 232 from the latches is also coupled to a pulse control circuit 202. As will be described in more detail in reference to FIG. 3, the feedback signal is used for controlling the pulse with of an output clock signal of the pulse generator. It should be noted that the feedback signal is provided from a node (i.e. the clock input) of latch circuit 208 to account for any parasitic resistances or capacitances of the wire traces used for implementing the latches, shown here with dashed boxes having a parasitic resistor 234 and a parasitic capacitor 236. While the feedback path 232 could be provided directly from the output of the pulse control circuit 202 or even internally within the pulse control circuit 202, the feedback path 232 is provided from the furthest latch to provide a worst case scenario for parasitic resistance and capacitance. By tapping off the feedback path from the furthest latch, the clock signal must travel through its own entire parasitic RC network. Therefore, the clock signal does not switch at the pulse generator before it switches at the furthest latch by bypassing some fraction of the downstream RC network.

Figure 3:
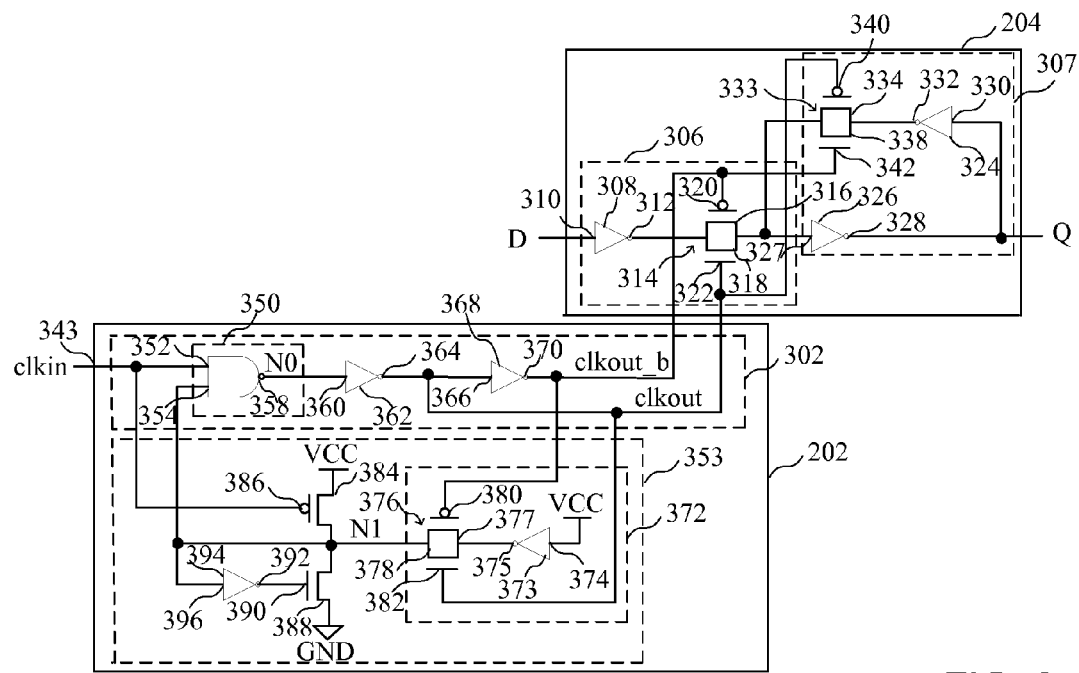
FIG. 3 is a block diagram of a pulse control circuit and a latch circuit.

Turning now to FIG. 3, a block diagram of a pulse control circuit 202 and a latch circuit 204 is shown. In particular, the latch circuit 204 comprises a first driver circuit 306 that controls a latch element 307. Input data (D) is coupled to an inverter 308 at an input 310 and has an output 312 that coupled to a gating circuit 314, shown here as a CMOS pass gate having a P-channel transistor 316 coupled with an N-channel transistor 318. A gate 320 of the P-channel transistor 316 is coupled to receive the inverted output clock signal (clkout_b) and a gate 322 of the N-channel transistor 318 is coupled to receive the output clock signal (clkout). The output 312 of the inverter 308 is coupled to the cross-coupled inverters 324 and 326 of the latch element 307. More particularly, the output 312 of the inverter 308 is coupled to an inverter 326 of the latch element 307 at an input 327, where the output data (Q) is generated at the output 328, which is also the output of the latch circuit. The output 328 of the inverter 326 is coupled to an input 330 of the inverter 324, where an output 332 of the inverter 324 is coupled to a gating circuit 333. The gating circuit 333 is shown here as a pass gate comprising a P-channel transistor 334 and an N-channel transistor 338. A gate 340 of the P-channel transistor 316 is controlled by the output clock signal, and the gate 342 of the N-channel transistor 318 is controlled by the inverted output clock signal.

The latch element 307 is controlled by the output clock signal and the inverted output clock signal, based upon the input clock signal (clkin) received at an input 343, generated by a pulse generator 302 of the pulse control circuit 202. In particular, a pulse gating circuit 350, shown here as a NAND gate, is coupled to receive the input clock signal at a first input 352 and a feedback signal at an output of a pulse shaping circuit 353 at an input 354. An output 358 of the pulse gating circuit 350 (at a node N0) is coupled to an input 360 of an inverter 362, where the output clock signal (clkout) is generated to an output 364 of the inverter 362. The output clock signal is coupled to an input 366 of an inverter 368 to generate the inverted output clock signal (clkout_b) at an output 370 of the inverter 368.

The pulse shaping circuit 353 is coupled to receive at least one of the output clock signal and the inverted output clock signal to provide the feedback clock signal to the input 354 of the pulse gating circuit 350. The pulse shaping circuit 353 comprises a second driver circuit 372 comprising an inverter 373 having an input 374 coupled to receive a reference voltage, shown here as VCC, and an output 375 coupled to a gating circuit 376, shown here as a CMOS pass gate comprising a P-channel transistor 377 and an N-channel transistor 378. The inverted clock signal is coupled to a gate 380 of the P-channel transistor 377 and the clock signal is coupled to a gate 382 of the N-channel transistor 378. While the gating circuits are shown as pass gates, it should be understood that they could be implemented as any other type latch gating mechanism such as a gating control circuit having two series pull-down transistors and two series pull-up transistors at the gated node, where the inner two transistors are controlled by a clock signal, for example.

An output of the second driver circuit 372 at a node N1 is also controlled by a series transistor arrangement, comprising a P-channel transistor 384 having a gate 386 coupled to the input clock signal and an N-channel transistor 388, where the drains of the P-channel transistor 384 and the N-channel transistor 388 are coupled together at the node N1. A gate 390 of the N-channel transistor is coupled to an output 392 of an inverter 394 having an input 396 coupled to the node N1.

In order to enable a shorter and more reliable pulse, the first driver circuit 306 that controls the latch element 307 and the second driver circuit 372 are matched. That is, they are implemented such that they have similar operating characteristics. For example, the inverter 373 tied to Vcc as well as downstream gating circuit 376 may have transistors that are sized (e.g. having the same gate widths and lengths) and laid out (e.g. having similar boundary conditions for the transistors) identically to transistors of inverter 308 and gating circuit 314 of the first two stages of the latch circuit 204 that is being driven by the pulse generator. The driver circuits 306 and 372 may also have the same circuit topology (e.g. having the same overall layout of the elements of the driver circuits) and orientation (e.g. whether laid out North-South or East-West). Since the required pulse width of the latch (i.e. the pulse width of the output clock signal clkout) is predominantly determined by the size and structure of the transistors of the gating circuits 314 and 376, the pulse generator better tracks the latch over PVT conditions. The feedback signals (e.g. the output clock and the inverted output clock) from the pulse generator output also sense downstream loading, and thus the slew rate of the latch is modulated to the pulse generator itself. In an arrangement where the pulse generator routes clock signals to a plurality of latch circuits, the feedback signals are preferably tapped off of the clock wires near one of the latches to incorporate the effects of the parasitic resistance and parasitic capacitance of the clock wire itself in the feedback signal, as set forth above.

Figure 4:
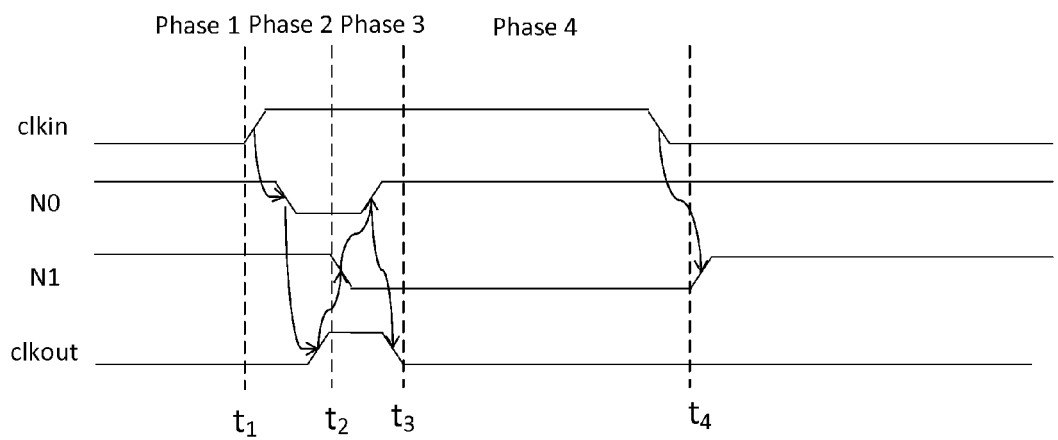
FIG. 4 is a timing diagram showing the operation of the pulse control circuit and latch circuit of FIG. 3.

The operation of the pulse generator is now described in reference to FIG. 4. The input clock signal clkin is initially low during a Phase 1, and the node N1 is initially high. Clkin transitions high at the beginning of a Phase 2, so clkout transitions high some time later at a time $t_2$ as N0 goes low. Then, the clkout signal opens the gating circuit 376 and allows the voltage at the node N1 to be driven low, which in turn forces the clkout signal low at a time $t_3$. The transistor 388 functions as a weak keeper to keep the voltage at the node N1 low between the time that the clkout signal transitions low and the clkin signal transitions low during Phase 4 (since the clkout pulse is much less than one half of a clock cycle). N1 starts to transition high at a time $t_4$ after the clkin signal transitions low to reset the pulse generator for the next pulse. It should be noted that the weak keeper transistor 388 is overdriven on the non-timing sensitive falling edge of clkin, where transistor 384 pulls N1 high. This can be accomplished for example by selecting transistor sizes where transistor 384 is stronger than transistor 388, enabling the transistor 384 to pull node N1 high when the clkin signal goes low.

Ratioed logic circuits (such as the circuit of FIG. 3 with the weak keeper transistor 388) must be carefully designed so that the weaker transistor is overdriven by the stronger transistor for functional operation. In deep submicron technologies, on-chip variation is substantial, and attempting to provide enough margin so that millions of circuit instances all operate without failure can be costly in terms of circuit area. This margin is often manifested in forcing the weak keeper to be multiple devices in series instead of just one device. In order to avoid issues of ratioed logic circuit, a pulse control circuit and a latch circuit could be implemented without a weak keeper (i.e. no ratioed logic). In particular, a transistor 502 is coupled in series between the transistor 384 and the transistor 388. The output of the pulse gating circuit 350 is coupled to the gate 504 of the transistor 502. Also, another inverter 506 is coupled in series with the inverter 394, where an input 508 is coupled to the input clock signal clkin and an output 510 is coupled to the input 396 of the inverter 394. However, the circuit of FIG. 5 consumes power on the falling edge of the clkin signal because the PMOS pullup transistor 384 and stacked NMOS pulldown transistors 388 and 502 are both momentarily on at the same time. Also, a race condition may be generated between two inverters 506 and 394 feeding the pulldown transistor 388 and the pulse gating circuit 350 that must be taken into account for the circuit to function. Simulations show that the pulse generator pulse width can be made 25% narrower by implementing a circuit having a feedback signal, as shown in FIGS. 3 and 5, compared to a generic pulse generator made from a chain of inverters and a NAND gate.

Turning now to FIG. 6, a flow chart shows a method of generating clock signals enabling the latching of data in an integrated circuit. In particular, a pulse generator for generating the output clock signal is implemented at a block 602. The pulse generator could be pulse generator 302, for example. The output clock signal of the pulse generator is coupled to a latch circuit, such as the latch circuit 204 for example, at a block 604. A feedback signal is provided to the pulse generator at a block 606. The feedback signal could be the output clock signal or the inverted output clock signal provided to the pulse shaping circuit 353, for example. A pulse width of the output clock signal, such as shown and described in reference to FIG. 4, is established using the feedback signal at a block 608.

Figure 7:
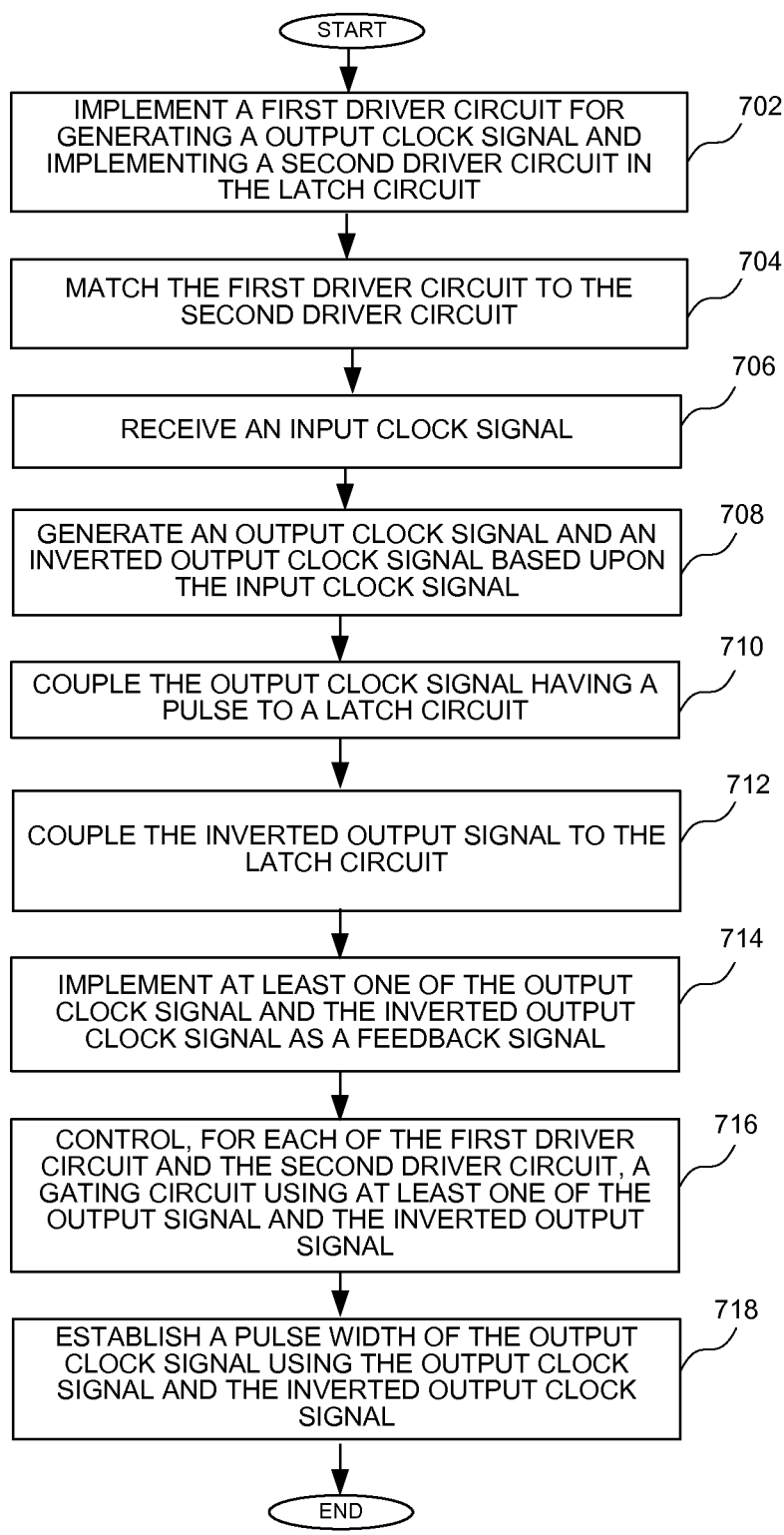
FIG. 7 is a flow chart showing another method of generating clock signals enabling the latching of data in an integrated circuit.

Turning now to FIG. 7, a flow chart shows another method of generating clock signals enabling the latching of data in an integrated circuit. A first driver circuit is implemented for generating an output clock signal and a second driver circuit is implemented in the latch circuit at a block 702. The first driver circuit could be implemented in the pulse shaping circuit 353 and the second driver circuit could be implemented in the latch circuit 204. The first driver circuit is matched to the second driver circuit at a block 704. The first and second driver circuits may be matched by implementing transistors having the same size and layout or where the driver circuits have the same topology or orientation, as set forth above. An input clock signal is received at a block 706. An output clock signal and an inverted output clock signal, such as clkout and clkout_b, are generated based upon the input clock signal at a block 708. The output clock signal having a pulse is coupled to a latch circuit at a block 710, and the inverted output clock signal is coupled to the latch circuit at a block 712. At least one of the output clock signal or the inverted output clock signal may be implemented as a feedback signal coupled to a pulse shaping circuit at a block 714. The pass gate is controlled, for each of the first driver circuit and the second driver circuit, using the output clock signal and the inverted output clock signal at a block 716. A pulse width of the output clock signal is established using the output clock signal and the inverted output clock signal at a block 718. The pulse width may be established by way of the pulse shaping circuit 353, for example.

It should be understood the methods of FIGS. 6 and 7 could be implemented using any of the circuits set forth above, or other suitable circuits. While specific blocks associated with the methods of FIGS. 6 and 7 are shown, it should be understood that other blocks of the methods or additional details related to the subject matter of a specific block could be found in the description of the circuit for receiving data.

It can therefore be appreciated that new circuits for and methods of generating clock signals enabling the latching of data has been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A circuit for generating clock signals enabling the latching of data, the circuit comprising:
   a pulse generator coupled to receive an input clock signal at an input and to generate an output clock signal at an output;
   a plurality of latch circuits coupled to receive the output clock signal; and
   a pulse shaping circuit coupled to receive a feedback signal from a latch circuit of the plurality of latch circuits that is furthest for the output clock signal to travel from the pulse generator;
   wherein a pulse width of the output clock signal is determined by the feedback signal and the input clock signal coupled to the pulse generator.

2. The circuit of claim 1 wherein each latch circuit of the plurality of latch circuits comprises a first driver and the pulse shaping circuit comprises a second driver that matches the first driver.

3. The circuit of claim 2 further comprising a first transistor coupled in series with a second transistor at a node of the pulse shaping circuit, wherein an output at the node of the pulse shaping circuit is coupled to the pulse generator.

4. The circuit of claim 3 wherein the input clock signal is coupled to control the first transistor, the pulse shaping circuit further comprising an inverter having an input coupled to the node and an output coupled to control the second transistor.

5. The circuit of claim 3 wherein the second driver circuit comprises a gating circuit controlled by the output clock signal.

6. The circuit of claim 5 wherein pulse generator further comprises a pulse control circuit coupled to receive the input clock signal at a first input and an output of the second driver at a second input.

7. The circuit of claim 6 further comprising a third transistor coupled in series with the second transistor, wherein the input clock signal is coupled to control the first transistor and the second transistor and an output of the pulse control circuit is coupled to control the third transistor.

8. A circuit for generating clock signals enabling the latching of data, the circuit comprising:
a pulse generator coupled to receive an input clock signal at an input and to generate an output clock signal at an output, the pulse generator having a first driver circuit;
a plurality of latch circuits coupled to receive the output clock signal, each latch circuit of the plurality of latch circuits having a second driver circuit; and
a pulse shaping circuit coupled to receive a feedback signal from a latch circuit of the plurality of latch circuits that is furthest for the output clock signal to travel from the pulse generator;
wherein the first driver circuit matches the second driver circuit; and
wherein a pulse width of the output clock signal is determined by the feedback signal and the input clock signal coupled to the pulse generator.

9. The circuit of claim 8 wherein each of the first driver circuit and the second driver circuit comprises an inverter and a gating circuit, and the first driver circuit matches the second driver circuit by implementing transistors having a common property from a group of properties consisting of transistor size, transistor layout, circuit topology and circuit orientation.

10. The circuit of claim 8 further comprising a first transistor coupled in series with a second transistor at a node, wherein an output of the first driver circuit is coupled to the node.

11. The circuit of claim 10 wherein the input clock signal is coupled to control the first transistor, the circuit further comprising an inverter having an input coupled to the node and an output to control the second transistor.

12. The circuit of claim 8 wherein the first driver circuit comprises a gating circuit controlled by the output clock signal.

13. The circuit of claim 12 wherein pulse generator further comprises a pulse control circuit coupled to receive the input clock signal at a first input and an output of the first driver at a second input.

14. The circuit of claim 13 further comprising a third transistor coupled in series with the second transistor, wherein the input clock signal is coupled to control the first transistor and the second transistor and an output of the pulse control circuit is coupled to control the third transistor.

15. A method of generating clock signals enabling the latching of data, the method comprising:
receiving an input clock signal at a pulse generator;
generating an output clock signal based upon the input clock signal;
coupling the output clock signal to each latch circuit of a plurality of latch circuits;
implementing the output clock signal provided to a latch circuit of the plurality of latch circuits that is furthest for the output clock signal to travel from the pulse generator as a feedback signal to control the pulse generator; and
establishing, using a pulse shaping circuit, a pulse width of a pulse of the output clock signal using the feedback signal and the input clock signal.

16. The method of claim 15 further comprising implementing a first driver circuit in the latch circuit and implementing a second driver circuit for generating the output clock signal, wherein the first driver circuit matches the second driver circuit.

17. The method of claim 16 further comprising implementing, for each of the first driver circuit and the second driver circuit, an inverter and a gating circuit.

18. The method of claim 17 wherein matching the first driver circuit to the second driver circuit comprises implementing transistors having a common property from a group of properties consisting of transistor size, transistor layout, circuit topology, and circuit orientation.

19. The method of claim 17 further comprising coupling an inverted output clock signal to the latch circuit and implementing the inverted output clock signal as a second feedback signal to control the pulse generator.

20. The method of claim 19 further comprising controlling, for each of the first driver circuit and the second driver circuit, the gating circuit using the output clock signal and the inverted output clock signal.

* * * * *